US009356113B2

(12) United States Patent
Tournier et al.

(10) Patent No.: US 9,356,113 B2
(45) Date of Patent: May 31, 2016

(54) METHOD OF PRODUCING A JUNCTION FIELD-EFFECT TRANSISTOR (JFET)

(75) Inventors: Dominique Tournier, Lyons (FR); Florian Chevalier, Saint Etienne (FR); Philippe Godignon, Barcelona (ES); José Millan, Barcelona (ES)

(73) Assignees: Institut National des Sciences Appliquees de Lyon (FR); Université Claude Bernard Lyon 1 (FR); Centre National de la Recherche Scientifique (CNRS) (FR); Ecole Centrale De Lyon (FR); Consejo Superior De Investigaciones Cientificas (CSIC) (ES)

(*) Notice: Subject to any disclaimer, the term of this patent is extended or adjusted under 35 U.S.C. 154(b) by 0 days.

(21) Appl. No.: 14/426,041
(22) PCT Filed: Sep. 5, 2012
(86) PCT No.: PCT/FR2012/051983
§ 371 (c)(1),
(2), (4) Date: Mar. 4, 2015
(87) PCT Pub. No.: WO2014/037628
PCT Pub. Date: Mar. 13, 2014

(65) Prior Publication Data
US 2015/0349084 A1      Dec. 3, 2015

(51) Int. Cl.
*H01L 29/66* (2006.01)
*H01L 29/423* (2006.01)
(Continued)

(52) U.S. Cl.
CPC .... *H01L 29/66068* (2013.01); *H01L 21/02532* (2013.01); *H01L 21/02595* (2013.01);
(Continued)

(58) Field of Classification Search
CPC ................ H01L 29/66068; H01L 21/02532; H01L 21/02595; H01L 21/0465; H01L 21/0475; H01L 29/1608; H01L 29/42316; H01L 29/66916

USPC .......................................................... 438/191
See application file for complete search history.

(56) References Cited

U.S. PATENT DOCUMENTS 5,753,938 A * 5/1998 Thapar ................ H01L 29/7722
257/136
2004/0135178 A1   7/2004 Onose et al.
(Continued)

FOREIGN PATENT DOCUMENTS

EP           1699083 A2      9/2006

OTHER PUBLICATIONS

Li S Y et al: "A Static Induction Transistor With Insulator Cover-Gare and With Triode-Like I-V Cgaracteristics", Solid State Electronics, Elsevier Science Publishers, Barking, GB, vol. 33, No. 3, Mar. 1, 1990, pp. 345-349, XP000127562.
(Continued)

*Primary Examiner* — Karen Kusumakar
*Assistant Examiner* — Adam S Bowen
(74) *Attorney, Agent, or Firm* — Lerner, David, Littenberg, Krumholz & Mentlik, LLP

(57) ABSTRACT

The invention concerns a method for producing a field effect transistor having a trench gate comprising: —the forming (110) of at least one trench (11, 12, 13) in a semi-conductive substrate (1) having a first type of conductivity, said substrate comprising two opposing faces called front face and rear face, —the primary implantation (120) of ions having a second type of conductivity so as to implant each trench of the substrate to form an active gate area, —the depositing (160) of a layer of polycrystalline silicon having the second type of conductivity on the implanted active gate area, —the oxidation (160) of the layer of polycrystalline silicon, and —the metallization (180) of the substrate on the front and rear faces of same in order to form active source and drain areas.

9 Claims, 3 Drawing Sheets

(51) Int. Cl.
*H01L 21/04* (2006.01)
*H01L 21/02* (2006.01)
*H01L 29/808* (2006.01)
*H01L 29/16* (2006.01)
*H01L 29/20* (2006.01)

(52) U.S. Cl.
CPC ........ *H01L21/0465* (2013.01); *H01L 21/0475* (2013.01); *H01L 29/42316* (2013.01); *H01L 29/66916* (2013.01); *H01L 29/66924* (2013.01); *H01L 29/8083* (2013.01); *H01L 29/1608* (2013.01); *H01L 29/2003* (2013.01)

(56) References Cited

U.S. PATENT DOCUMENTS

2010/0078754 A1* 4/2010 Veliadis .............. H01L 29/0619
257/491
2012/0104467 A1* 5/2012 Li ....................... H01L 29/1066
257/256

OTHER PUBLICATIONS

International Search Report for Application No. PCT/FR2012/051983 dated May 27, 2013.

* cited by examiner

METHOD OF PRODUCING A JUNCTION FIELD-EFFECT TRANSISTOR (JFET)

CROSS REFERENCE TO RELATED APPLICATIONS

The present application is a national phase entry under 35 U.S.C. §371 of International Application No. PCT/FR2012/051983, filed Sep. 5, 2012, published in French, the disclosure of which is incorporated by reference herein.

TECHNICAL FIELD

The present invention relates to the technical field of vertical and/or quasi-vertical field-effect transistors, and especially junction field-effect transistors (hereinbelow called "JFET", acronym of the expression "Junction Field Effect Transistor").

PRESENTATION OF THE PRIOR ART

A JFET power transistor is a vertical or quasi-vertical field-effect transistor used as controlled power switch.

A vertical field-effect transistor differs from a classic field-effect transistor due to the fact that the conductive channel of the transistor extends perpendicularly to the surface of the substrate on which the transistor is made.

A quasi-vertical field-effect transistor differs from a vertical field-effect transistor by the fact that the conductive channel of the transistor extends perpendicularly to the surface of the substrate on which the transistor is manufactured, and that the layer comprising the conductive channel is placed on a semi-isolating substrate (SOI, GaN/Si for example).

FIG. 1 schematically illustrates the principal elements constituting a vertical and quasi-vertical field-effect transistor. This transistor comprises a substrate 21 having two opposite faces called "front face" 22 and "rear face" 23. The substrate 21 further comprises at least one trench 24 at the level of its front face 22.

The rear face 23 of the transistor is covered by a metallic layer 25 and forms the drain D of the transistor.

The front face 22 of the substrate is covered by a metallic layer 26 and forms the source S of the transistor.

In the case of a JFET transistor, the gate is formed by ionic implantation 27 at the base of the trench etched in the substrate. This gate G is insulated electrically from the source S by means of an electrically insulating layer 28.

But implantation in trenches, and in other steps of manufacturing methods of JFET transistors—such as epitaxy in trenches or epitaxy on epitaxied areas—are complex to execute.

In particular, the implantation step of the substrate to form the gate is relatively costly in time and money, as it requires for example specific equipment such as implantation systems comprising goniometers for implantation with controlled angles, and/or implantation systems for setting in rotation of substrates during implantation.

Also, the implantation step results in a substantial dispersion of the electrical characteristics of the components obtained, such that the repetitiveness of the electronic characteristics of the JFET transistors coming from these manufacturing methods is very difficult to attain.

An aim of the present invention is to propose a simpler manufacturing method for a JFET transistor for improving the manufacturing yield and obtaining a better rate of integration (increase of the current density) than existing manufacturing, in order to reduce the size of controlled components and the values of internal capacities of controlled components.

Another aim of the present invention is to provide a controlled component having low resistance to the on state, and low commutation losses.

SUMMARY OF THE INVENTION

For this purpose, the invention proposes a manufacturing method of a field-effect transistor of trench gate type, comprising:
  formation of at least one trench in an active semi-conductive layer of a first type of conductivity of a substrate comprising two opposite faces called front face and rear face,
  primary implantation of ions having a second type of conductivity so as to implant each trench of the substrate to form an implanted area,
  deposit of a layer of poly-crystalline silicon of the second type of conductivity on the implanted area,
  partial oxidation of the layer of poly-crystalline silicon to obtain an electrically insulating film of oxidized poly-crystalline silicon on a sub-layer of non-oxidized poly-crystalline silicon, the sub-layer of poly-crystalline silicon and the implanted area forming an active gate region, and
  metallization of the substrate on its front face to form an active source region, and
  metallization of the substrate on another face to form an active drain region.

Within the scope of the present invention "substrate" means one (or more) layer(s) of material such as a stack:
  of an active layer of gallium nitride GaN on one (or more) interface layer(s) on a support layer (of silicon, sapphire, etc.); this produces a quasi-vertical transistor such as illustrated in FIG. 4 when the drain of the transistor is made on the front face of the support layer,
  of a layer of silicon carbide SiC on a support layer of $N^{++}$ doped silicon carbide, producing a vertical transistor such as illustrated in FIG. 2.

The fact of oxidizing the layer of poly-crystalline silicon forms an insulating layer on the layer of poly-crystalline silicon. The succession of steps of depositing a layer of poly-crystalline silicon and its oxidation forms the active gate region more effectively than with the methods of the prior art.

Preferred, though non-limiting, aspects of the manufacturing method according to the invention are the following:
  the formation step comprises the sub-steps of:
    deposit of a primary mask on the front face of the semi-conductive substrate, the primary mask including a principal opening and two subsidiary openings, the dimensions of the principal opening being greater than the dimensions of the subsidiary openings,
    primary etching of the substrate through the principal opening to form a principal trench, and through the subsidiary openings to form two subsidiary trenches,
  the primary implantation step being conducted through the primary mask; use of the same mask to make the trench and implantation enables auto-alignment of the transistor;
  the method further comprises:
    a step for deposit of a secondary etching mask on the front face of the substrate following the primary implantation step, said secondary etching mask including a secondary etching opening extending above the principal trench, a step of secondary etching of the substrate through the secondary etching opening to form a secondary trench in the principal trench;

the method further comprises a step for removing the primary mask prior to depositing of the secondary etching mask;

the method further comprises:
  a step for deposit of a secondary implantation mask on the front face of the substrate following the secondary etching step, the secondary implantation mask including a secondary implantation opening extending above the secondary trench,
  a secondary implantation of ions step of the second type of conductivity through the secondary implantation opening;

the method further comprises the removal of the secondary etching mask prior to depositing of the secondary implantation mask;

the method further comprises:
  a step for deposit of a tertiary etching step on the front face of the substrate, following the oxidation step of the layer of poly-crystalline silicon, said tertiary etching step including a tertiary etching opening extending above the secondary trench,
  the etching of the substrate through the tertiary etching opening to eliminate the poly-crystalline silicon extending over the surface of the secondary trench;

the substrate is of the silicon carbide;

the primary implantation step comprises implantation of ions at a depth of between 0 and over 1 µm; in the embodiment where the depth of implantation is zero, the implantation step is not performed;

each implantation step comprises the implantation of ions at an implantation dose of between $10^{12}$ cm$^{-2}$ and $10^{16}$ cm$^{-2}$;

the step for deposit of the layer of poly-crystalline silicon is performed either by sputtering, or in steam phase, to form a heterojunction.

BRIEF DESCRIPTION OF DRAWINGS

Other advantages and characteristics of the method according to the invention and of the associated product will emerge more clearly from the following description of several variant embodiments, given by way of non-limiting examples from the appended drawings, wherein.

DETAILED DESCRIPTION OF THE INVENTION

Figure 1:
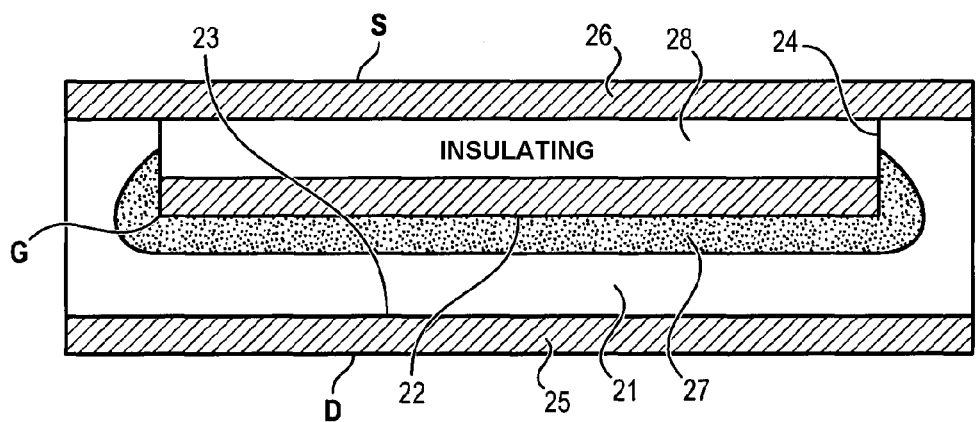
FIG. 1 illustrates an example of a vertical field-effect transistor of the prior art.
Figure 2:
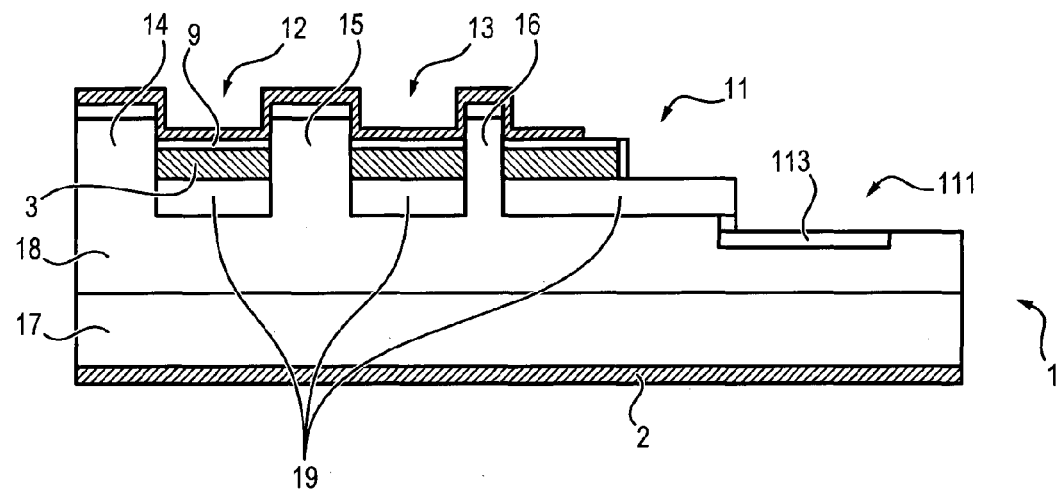
FIG. 2 illustrates an example of a JFET transistor vertical obtained by executing the manufacturing method illustrated in FIG. 3.
Figure 3:
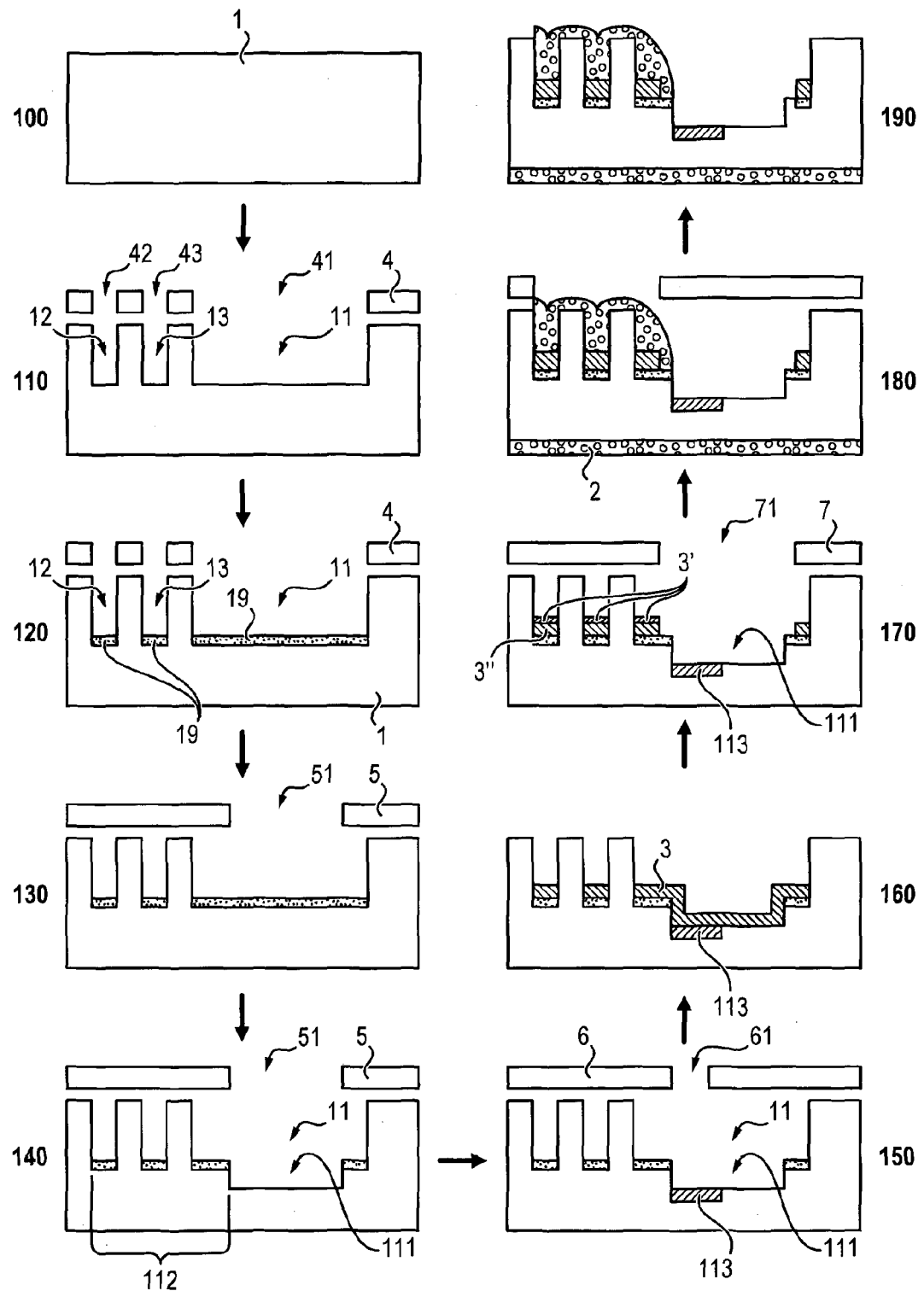
FIG. 3 illustrates an example of manufacturing method of a JFET transistor.

In reference to FIG. 2, this illustrates an example of a JFET transistor of type N obtained by carrying out the manufacturing method illustrated in FIG. 3.

The transistor comprises a substrate 1 including a principal trench 11 and two subsidiary trenches 12, 13. These trenches 11, 12, 13 are separated by pillars 14, 15, 16 of a height of 3 µm and width greater than or equal to 2 µm, corresponding to a height/width ratio of between 1 and 5.

The substrate also comprises a secondary trench 111 in the principal trench 11. This secondary trench comprises an implanted conductivity area 113 of type P, called junction termination extension (or "JTE", acronym of the expression "Junction Termination Extension"). The presence of this implanted area 113 of type P ensures good power supply to the JFET transistor.

The material constituting the substrate 1 can be silicon carbide, or any other type of wide-bandgap semiconductor known to the person skilled in the art. For example, the material constituting the substrate can be diamond or gallium nitride (or "GaN", acronym of the expression "gallium nitride").

The substrate 1 comprises a layer of N-doped base 17, and an epitaxied N doped layer 18 on the layer of base 17. The substrate further comprises implanted regions 19 of the epitaxied layer 18 extending between the pillars 14, 15, 16. These implanted regions of type P form the gate of the JFET transistor with the regions 3.

The rear face of the substrate—corresponding to the face of the base layer opposite the epitaxied layer—comprises a metallic layer 2 forming the drain of the JFET transistor. The front face of the substrate further comprises a metallic layer 9 forming the source of the JFET transistor.

The transistor further comprises doped layers of poly-crystalline silicon 3 on the implanted regions 19 of the substrate. Advantageously, the layers of poly-crystalline silicon can be replaced by layers of any type of filler material for making a heterojunction.

The structure of the transistor illustrated in FIG. 2 lets it have specific conduction resistance less than JFET transistors of the prior art.

The topology of the structure also allows integration of:
  an internal diode of strong current rating,
  current and temperature sensors.

The integration of current sensors in the JFET transistor illustrated in FIG. 2 makes it easier to monitor the electrical state of the JFET transistor to predict any degradation thereof.

The JFET transistor illustrated in FIG. 2 is adapted for high-frequency operation. It is compatible with high-voltage applications and average temperature (i.e. 300° C.). It can be used for designing power-conversion systems of type voltage inverter, current inverter or any other converter (DC/DC, DC/AC, multi-level, etc.).

Executing the method described earlier produces a field-effect semiconductor device with trench comprising a control electrode of mixed type (heterojunction/PN).

FIG. 3 schematically illustrates an example of a manufacturing method of a JFET transistor.

Step 110 for Formation of Trenches

The method comprises a step 110 for formation of a principal trench 11 and two subsidiary trenches 12, 13 in a substrate 1 of silicon carbide of conductivity of type N.

For this, the following sub-steps are conducted:
  deposit of a primary mask 4, and
  etching of the substrate through the primary mask.

Deposit of the primary mask 4 can be done by any technique known to the person skilled in the art. For example, in an embodiment the step for deposit of the mask comprises:
  deposit of a layer of dielectric such as silicon nitride over the entire surface of the substrate, and
  etching of the layer of dielectric—especially by photolithography—so as to define openings 41, 42, 43 in the layer of dielectric exposing micrometric regions of the surface of the substrate.

The person skilled in the art will appreciate that other dielectric materials—such as $SiO_2$ or TiN, etc.—can be used to make the primary mask 4.

In the embodiment illustrated in FIG. 3, the primary mask 4 comprises a principal opening 41 and two subsidiary openings 42, 43. The dimensions of the subsidiary openings 42, 43 are less than the dimensions of the principal opening 41.

The etching of the substrate 1 is done through the openings 41, 42, 43 of the primary mask 4. The etching of the substrate 1 through the principal opening 41 allows making a large-dimension principal trench 11. The etching of the substrate 1 through the subsidiary openings 42, 43 produces two subsidiary trenches 12, 13.

The threshold voltage and the specific resistance of the JFET transistor obtained on completion of the method depend especially on the width and depth of the trenches.

On completion of the formation step of the trenches, the primary mask is held in position to perform an implantation step of the substrate through the openings of the primary mask.

Ionic Implantation Step 120

The ionic implantation step 120 allows formation of gate areas of the JFET transistor. This implantation requires no particular orientation of the substrate, contrary to manufacturing methods of JFET transistors of the prior art.

In the embodiment illustrated in FIG. 3, the implanted ions present conductivity of type P+ (the substrate having conductivity of type N). This enables a drop in leak current on the gate electrode of the JFET transistor.

The dose of implanted ions can be between $10^{12}$ and $10^{16}$ $cm^{-2}$, and the depth of implantation can vary between 1 nm and 0.2 μm starting from the free surface of the trenches 11, 12, 13.

The implantation of ions can be undertaken during a single step or during successive steps. The temperature can be between 4K and 1000K during the implantation step, according to the type of primary mask used.

In all cases, the implantation step 120 produces implanted regions 19 at the base of the principal and subsidiary trenches 11, 12, 13.

Step for Formation of a Secondary Trench

Optionally, the method can comprise a formation step 130, 140 of a secondary trench 111 in the principal trench 11 on completion issue of the implantation step 120.

To form the secondary trench 111, the following sub-steps can be performed:
  deposit of a secondary etching mask 5,
  etching of the substrate through the secondary etching mask 5.

As earlier in reference to the primary mask 4, the deposit of the secondary etching mask 5 can be done by any technique known to the person skilled in the art (i.e. growth of a layer of dielectric on the substrate and etching by photolithography of this layer to define an opening).

In the embodiment illustrated in FIG. 3, the secondary etching mask 5 comprises a secondary etching opening 51.

The secondary etching opening 51 has dimensions less than the dimensions of the principal opening 41 of the primary mask 4.

This secondary etching opening 51 is positioned above the principal trench 11 for the creation of the secondary trench 111 in the principal trench 11. More precisely, the secondary etching opening 51 is positioned on the substrate 1 such that the projection on the secondary etching mask 5 of the edges of the principal trench 11:
  encloses the edges of the secondary etching opening 51,
  is not in contact with the edges of the secondary etching opening 51.

In the embodiment illustrated in FIG. 3, the primary mask 4 is removed, for example by etching, prior to depositing of the secondary etching mask 5. As a variant, the secondary etching mask 5 can be deposited directly on the primary mask 4.

Once the secondary etching mask 5 is deposited, etching of the substrate 1 is performed through the secondary etching opening 51. This creates a secondary trench 111 in the principal trench 11 to define a mesa-structure 112 having the form of a raised plateau.

Etching of a secondary trench 111 in the principal trench 11 protects a peripheral sector of the JFET transistor.

Secondary Implantation Step 150 in the Secondary Trench

The method can also comprise an optional step 150 of secondary ionic implantation in the secondary trench 111, improving the voltage of the JFET transistor.

For completion of secondary implantation of the secondary trench 111, the following sub-steps are conducted:
  deposit of a secondary implantation mask 6 on the substrate 1,
  ionic implantation through the secondary implantation mask 6.

Here too, the deposit of the secondary implantation mask 6 can be based on any technique known to the person skilled in the art.

In the embodiment illustrated in FIG. 3, the secondary implantation mask 6 comprises a secondary implantation opening 61. This secondary implantation opening 61 has dimensions less than the dimensions of the secondary etching opening 51 of the secondary etching mask 5.

The secondary implantation opening 61 extending above the secondary trench 111. In particular, the secondary implantation opening 61 is positioned such that the projection on the secondary implantation mask 6 of the edges of the secondary trench 111 encloses the edges of the secondary implantation opening 61 without being in contact with the latter.

In the embodiment illustrated in FIG. 3, the secondary etching mask 5 is removed prior to depositing of the secondary implantation mask 6. By way of variant, the secondary implantation mask 6 can be deposited directly on the secondary etching mask 5.

Ionic implantation of ions of conductivity of type P is then carried out through the secondary implantation opening 61. The dose of implanted ions can be of the order of $10^{15}$ $cm^{-2}$.

The secondary implantation step causes formation of an implanted area 113 of conductivity of type P in the secondary trench 111.

On completion of this secondary implantation step, the secondary implantation mask is removed from the substrate.

Step 160 of Deposit and Oxidation of a Layer of Poly-Crystalline Silicon

A layer of doped P poly-crystalline silicon 3 is then deposited over the entire surface of the substrate. This layer of poly-crystalline silicon is electrically conductive.

The deposit 160 of the layer of poly-crystalline silicon 3 can be done for example by epitaxy. This deposit step 160 ends in formation of a layer of poly-crystalline silicon in the trenches principal 11 and subsidiary 12, 13 of the substrate.

Next, an oxidation step of the layer of poly-crystalline silicon 3 is carried out over a certain thickness of the latter. Oxidation then produces a film 3' of oxidized electrically insulating poly-crystalline silicon on a sub-layer 3" of non-oxidized doped P poly-crystalline silicon. The sub-layer of poly-crystalline silicon 3" and the implanted regions 19 form the gate of the transistor. The film of oxidized poly-crystalline silicon 3' electrically insulates this gate of the source of the transistor (done in a later step of the method).

During this oxidation step, the poly-crystalline silicon is consumed and tends to disappear. This consumption of the poly-crystalline silicon occurs mainly at the level of the large surfaces of the layer of poly-crystalline silicon, and therefore mainly in the secondary trench 111 of the substrate 1.

Advantageously, the thickness of the layer of poly-crystalline silicon deposited initially (i.e. prior to oxidation) is provided such that the remaining thickness of oxidized poly-crystalline silicon (i.e. after the oxidation step) is substantially equal to 1.5 µm, corresponding around a 2/3 ratio of the depth of the trenches 12 and 13.

Apart from the dimensions of the trenches, the threshold voltage and the specific resistance of the JFET transistor obtained on completion of the method depend also on the thickness of the layer of poly-crystalline silicon as well as the value of its doping.

Therefore, the electrical characteristics of the JFET transistor depend on easily controlled parameters (i.e. width and depth of trenches, thickness and doping of the layer of poly-crystalline silicon) of the manufacturing method illustrated in FIG. 3.

Optional Etching Step of the Superfluous Oxidized Poly-Crystalline Silicon

In the event where the layer of oxidized poly-crystalline silicon is not completely consumed at the level of the secondary trench 111, the method can comprise an extra etching step 170.

This eliminates the oxidized poly-crystalline silicon remaining in the secondary trench 111.

For this, a tertiary etching mask 7 is deposited on the substrate 1. This tertiary etching mask 7 comprises a tertiary etching opening 71 extending above the secondary trench 111. The dimensions of the tertiary etching opening 73 are equal to that of the secondary trench 111.

Etching is then performed through the tertiary etching opening 73 to consume the superfluous oxidized poly-crystalline silicon located in the secondary trench 111.

Front and Rear Face Metallization Step of the Substrate

Following the step for deposit and oxidation of the layer of poly-crystalline silicon, metallization of the rear face of the substrate can be done to form the drain of the JFET transistor.

Similarly, a step for deposit of a metallic layer is done on the front face of the substrate to form the source of the JFET transistor. This front face metallization is carried out at the mesa-structure of the substrate using a mask including an opening positioned above the subsidiary trenches and a surface of the principal trench not having the secondary trench 111.

After a rapid thermal annealing step and two optional polishing steps of the front and rear faces of the substrate, the result is the JFET transistor similar to the JFET transistor illustrated in FIG. 2.

The manufacturing method described hereinabove has many advantages relative to the prior art and enables especially:
 reduction in the number of manufacturing steps,
 a significant drop in manufacturing costs,
 simplification of the geometry, scaling and manufacture of the JFET transistor,
 better control of the threshold voltage of the JFET transistor,
 a decrease in the switching time of the JFET transistor between an on state and a blocked state.

Figure 4:
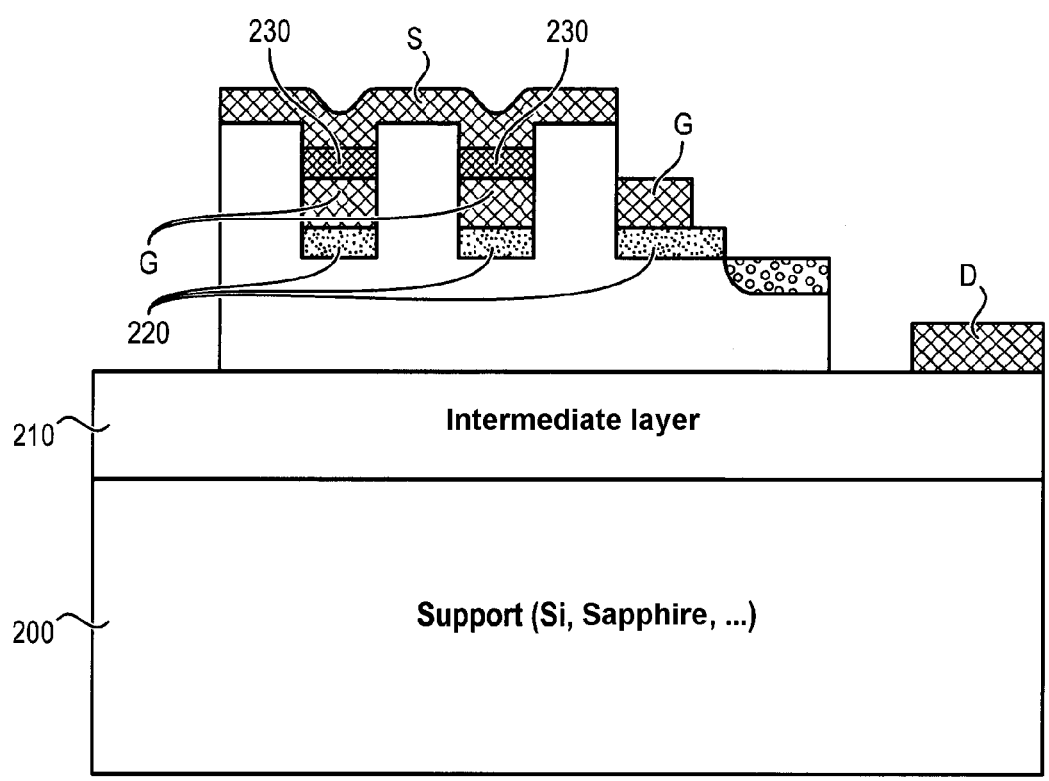
FIG. 4 illustrates an example of a quasi-vertical JFET transistor.

In reference to FIG. 4, this illustrates another example of a transistor obtained by executing the method illustrated in FIG. 3. The transistor comprises a support 200 made of silicon or sapphire material.

It further comprises one (or more) intermediate layer(s) 210. The intermediate layer(s) comprises or comprise for example a layer of aluminium nitride AlN, a layer of $SiO_2$, and a layer of gallium nitride aluminium AlGaN.

The transistor finally comprises an active layer of gallium nitride GaN including:
 principal and subsidiary trenches,
 an implanted region in each trench
 a layer of poly-crystalline silicon G in each secondary trench—these adjacent layers forming the gate of the transistor,
 an insulating layer of oxidized poly-crystalline silicon on the layers of poly-crystalline silicon forming gate G of the secondary trenches,
 a metallic layer extending over the insulating layers of the secondary trenches to form the source S.

In the embodiment illustrated in FIG. 4, the active layer does not cover the whole surface of the interface. A metal pin forming a drain is arranged on the region of the interface layer not covered by the active layer, resulting in a quasi-vertical transistor.

The person skilled in the art will have understood that many modifications can be made to the method described hereinabove without materially departing from the ideas presented here. For example, even though the method has been described in reference to the manufacture of a transistor N, it can be used for the manufacture of a JFET transistor of type P.

It is therefore evident that the examples given above are only particular illustrations and in no case limiting.

The invention claimed is:

1. A manufacturing method of a field-effect transistor of trench gate type, comprising:
    formation of at least one trench in an active semi-conductive layer of a first type of conductivity of a substrate comprising two opposite faces called front face and rear face,
    primary implantation of ions having a second type of conductivity so as to implant each trench of the substrate to form an active gate region,
    deposit of a layer of poly-crystalline silicon of the second type of conductivity on the implanted active gate region,
    partial oxidation of the layer of poly-crystalline silicon to obtain an electrically insulating film of oxidized poly-crystalline silicon on a sub-layer of non-oxidized poly-crystalline silicon, the sub-layer of poly-crystalline silicon and the implanted area forming an active gate region, and
    metallization of the substrate on its front face to form an active source region, and
    metallization of the substrate on another face to form an active drain region,
    wherein the formation step comprises the sub-steps of:
        depositing a primary mask on the front face of the semi-conductive substrate, the primary mask including a principal opening and two subsidiary openings, the dimensions of the principal opening being greater than the dimensions of the subsidiary openings,
        primary etching of the substrate through the principal opening to form a principal trench, and through the subsidiary openings to form two subsidiary trenches,
    the primary implantation step being done through the primary mask,
    wherein the method further comprises:
        a deposit step of a secondary etching mask on the front face of the substrate following the primary implantation step, said secondary etching mask including a secondary etching opening extending above the principal trench, a secondary etching step of the substrate through the secondary etching opening to form a secondary trench in the principal trench.

2. The manufacturing method according to claim 1, which further comprises a step for removing the primary mask prior to depositing of the secondary etching mask.

3. The manufacturing method according to claim 1, which further comprises:

a deposit step of a secondary implantation mask on the front face of the substrate following the secondary etching step, the secondary implantation mask including a secondary implantation opening extending above the secondary trench, a secondary ion-implantation step of the second type of conductivity through the secondary implantation opening.

4. The manufacturing method according to claim 3, which further comprises the removal of the secondary etching mask prior to depositing of the secondary implantation mask.

5. The manufacturing method according to claim 1, which further comprises:

a deposit step of a tertiary etching mask on the front face of the substrate, following the oxidation step of the layer of poly-crystalline silicon, said tertiary etching mask including a tertiary etching opening extending above the secondary trench, etching of the substrate through the tertiary etching opening to eliminate the poly-crystalline silicon extending over the surface of the secondary trench.

6. The manufacturing method according to claim 1, wherein the substrate is silicon carbide.

7. The manufacturing method according to claim 1, wherein the primary implantation step comprises the implantation of ions at a depth of between 1 nm and 0.2 μm.

8. The manufacturing method according to claim 1, wherein each implantation step comprises the implantation of ions at an implantation dose of between $10^{12}$ cm$^{-2}$ and $10^{16}$ cm$^{-2}$.

9. The manufacturing method according to claim 1, wherein the step for deposit of the layer of poly-crystalline silicon is done either by pulverisation or in the steam phase to form a heterojunction.

* * * * *